United States Patent
Shioga et al.

(10) Patent No.: US 9,476,914 B2
(45) Date of Patent: Oct. 25, 2016

(54) INTERCONNECTION CARD FOR INSPECTION, MANUFACTURE METHOD FOR INTERCONNECTION CARD, AND INSPECTION METHOD USING INTERCONNECTION CARD

(71) Applicant: FUJITSU LIMITED, Kawasaki-shi, Kanagawa (JP)

(72) Inventors: Takeshi Shioga, Kawasaki (JP); Kazuaki Kurihara, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 588 days.

(21) Appl. No.: 13/667,501

(22) Filed: Nov. 2, 2012

(65) Prior Publication Data

US 2013/0055567 A1    Mar. 7, 2013

Related U.S. Application Data

(60) Division of application No. 12/824,896, filed on Jun. 28, 2010, now Pat. No. 8,330,480, which is a continuation of application No. PCT/JP2008/001037, filed on Apr. 21, 2008.

(51) Int. Cl.
  *H05K 3/10* (2006.01)
  *G01R 3/00* (2006.01)
  *G01R 1/073* (2006.01)

(52) U.S. Cl.
  CPC .............. *G01R 3/00* (2013.01); *G01R 1/07378* (2013.01); *Y10T 29/49155* (2015.01)

(58) Field of Classification Search
  CPC ................ G01R 1/07378; G01R 3/00; Y10T 29/49155
  USPC .................................. 324/765, 765.01, 755.11
  See application file for complete search history.

(56) References Cited

U.S. PATENT DOCUMENTS

| 3,759,761 | A | * | 9/1973 | Takaaki et al. ............... 438/310 |
| 5,027,253 | A | * | 6/1991 | Lauffer .................. H05K 1/162 257/916 |
| 5,329,423 | A | | 7/1994 | Scholz |
| 6,235,581 | B1 | * | 5/2001 | Chen ............................ 438/257 |
| 6,314,641 | B1 | | 11/2001 | Akram |
| 6,388,456 | B1 | | 5/2002 | Kojima |
| 6,466,047 | B1 | | 10/2002 | Doherty et al. |

(Continued)

FOREIGN PATENT DOCUMENTS

| EP | 0840133 | A2 | 5/1998 |
| JP | 06-120305 | A | 4/1994 |

(Continued)

OTHER PUBLICATIONS

Kim, Tae Hoon et al., Interconnection via technology and wafer level package for crystal unit device, 33rd IEMTC, 2008, p. 1-5.*

(Continued)

*Primary Examiner* — Thomas Valone
(74) *Attorney, Agent, or Firm* — Westerman, Hattori, Daniels & Adrian, LLP

(57) ABSTRACT

Recesses are formed on one surface of a substrate. A conductive film covers an inner surface of each of the recesses. This conductive film contacts a bump of a semiconductor device to be inspected and is electrically connected to the bump. It is therefore possible to prevent damages of the bump to be caused by contact of a probe pin.

3 Claims, 9 Drawing Sheets

(56) References Cited

U.S. PATENT DOCUMENTS

| | | | |
|---|---|---|---|
| 6,615,613 B1* | 9/2003 | Iwabuchi et al. | 65/61 |
| 6,634,100 B2 | 10/2003 | Akram et al. | |
| 7,088,118 B2 | 8/2006 | Liu et al. | |
| 7,098,680 B2 | 8/2006 | Fukushima et al. | |
| 7,102,367 B2 | 9/2006 | Yamagishi et al. | |
| 7,129,156 B2 | 10/2006 | Akram et al. | |
| 7,471,096 B2 | 12/2008 | Kohashi et al. | |
| 7,531,906 B2 | 5/2009 | Lee | |
| 7,745,924 B2 | 6/2010 | Shioga et al. | |
| 2002/0084456 A1 | 7/2002 | Sugihara et al. | |
| 2004/0239349 A1 | 12/2004 | Yamagishi et al. | |
| 2006/0163740 A1 | 7/2006 | Ohno et al. | |
| 2010/0264951 A1* | 10/2010 | Shioga | G01R 1/07378 324/762.02 |

FOREIGN PATENT DOCUMENTS

| | | |
|---|---|---|
| JP | 6-120305 A | 4/1994 |
| JP | 10-132855 A | 5/1998 |
| JP | 10-239354 A | 9/1998 |
| JP | 2000-304770 A | 11/2000 |
| JP | 2002-174667 A | 6/2002 |
| JP | 10-239354 A | 10/2003 |
| JP | 2004-047667 A | 2/2004 |
| JP | 2004-069692 A | 3/2004 |
| JP | 2004-233155 A | 8/2004 |
| JP | 2008-089461 A | 4/2008 |
| WO | 2007-123150 A1 | 11/2007 |

OTHER PUBLICATIONS

International Search Report of PCT/JP2008/001037, Mailing Date of Jun. 24, 2008.
Japanese Office Action dated Jun. 26, 2012, issued in corresponding Japanese Patent Application No. 2010-508973, with English translation (8 pages).
Translation of the Written Opinion of the International Search Authority of PCT/JP2008/001037, Mailing Date of Jun. 24, 2008.
Japanese Office Action dated Sep. 10, 2013, issued in corresponding Japanese Patent Application No. 2010-508973, w/ English translation.

* cited by examiner

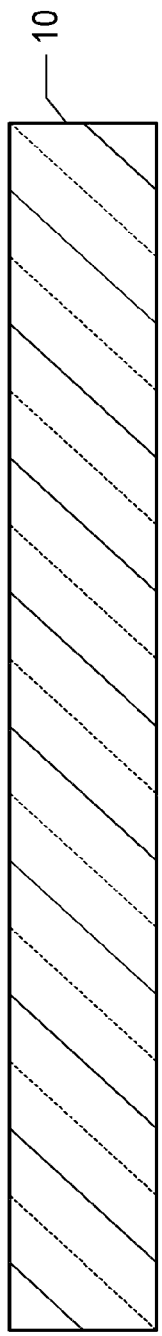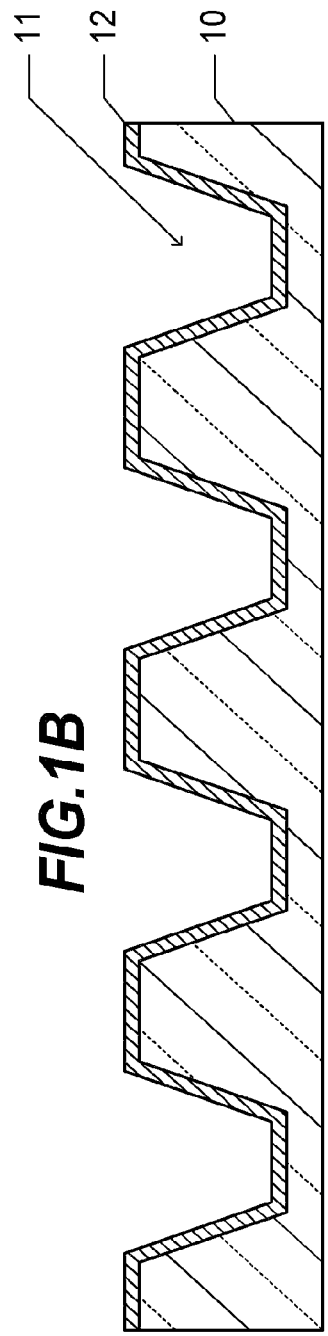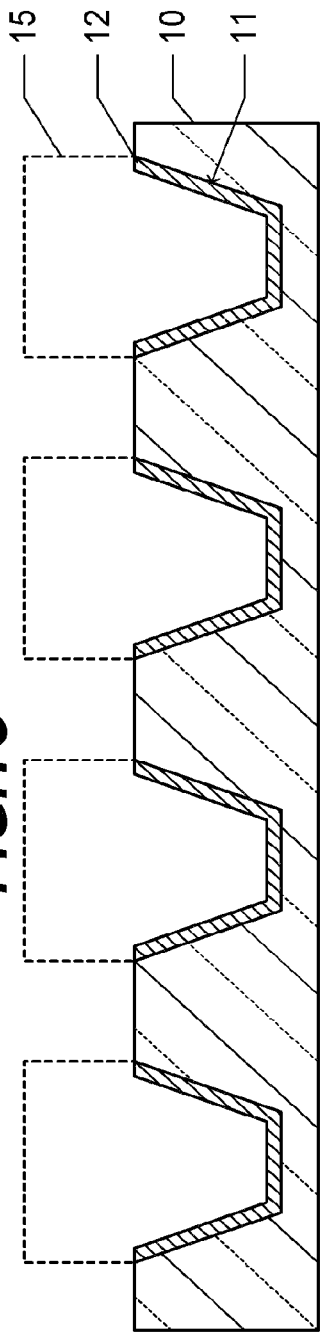

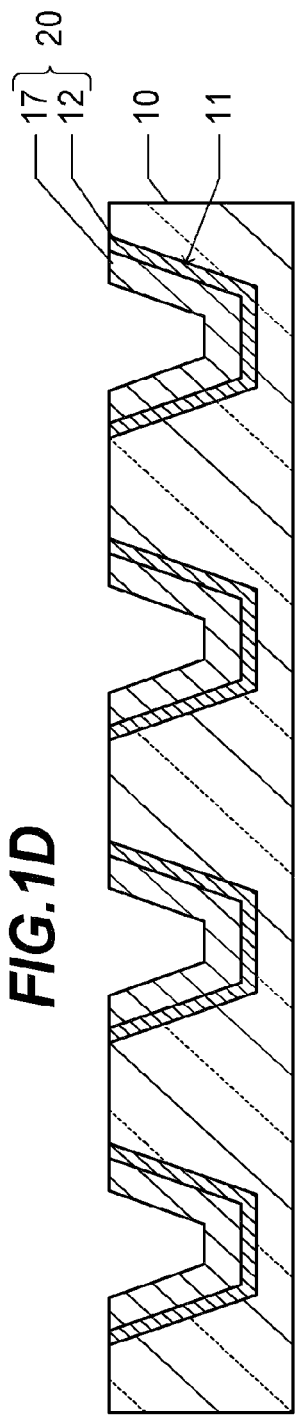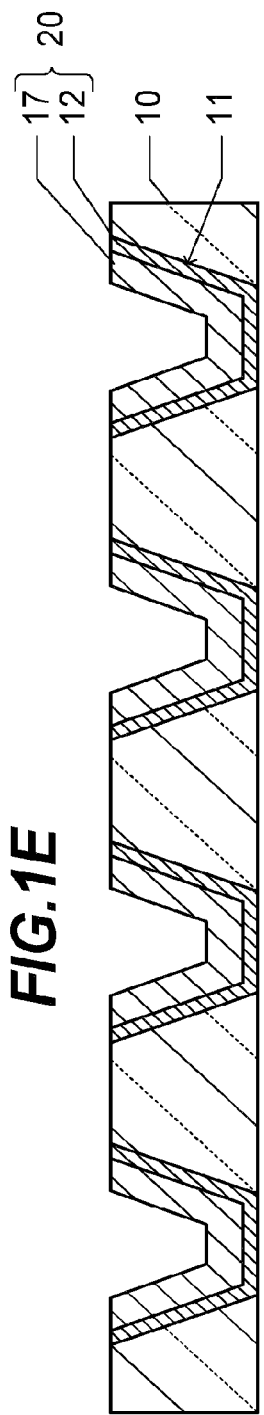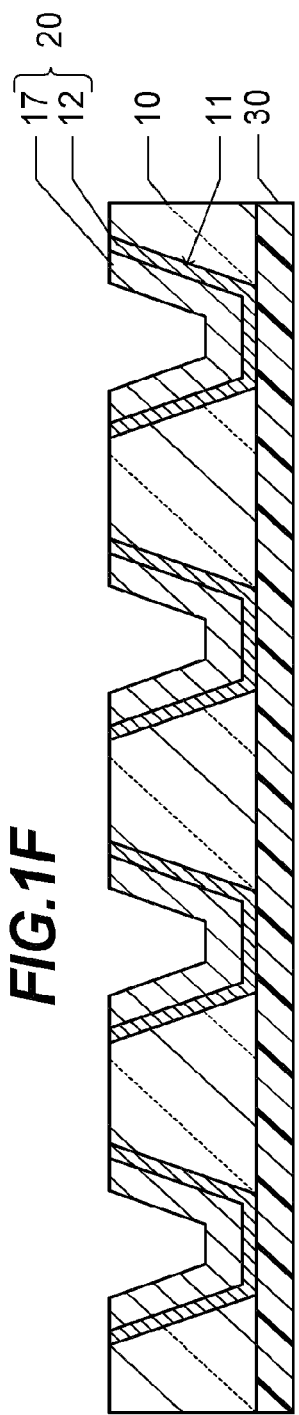

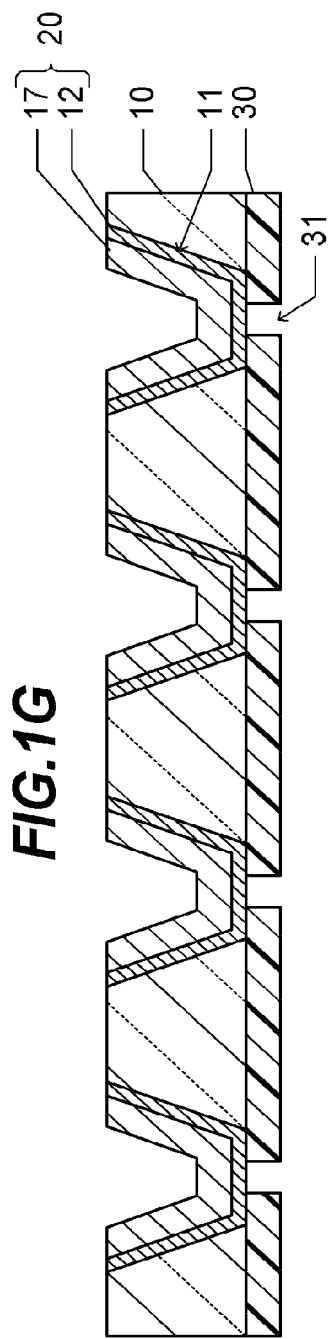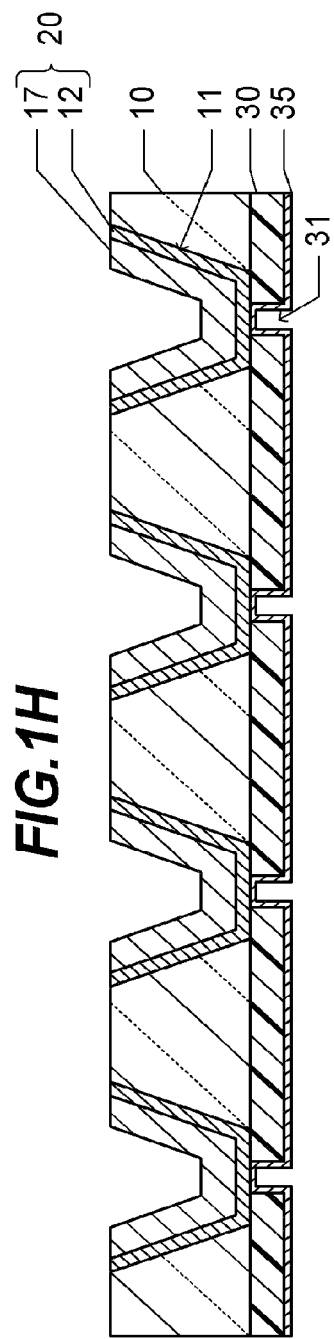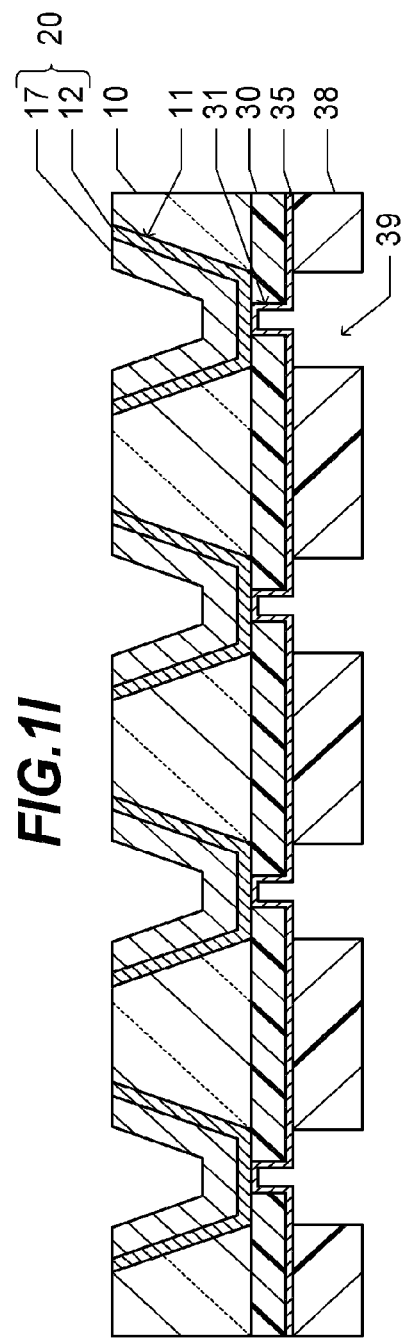

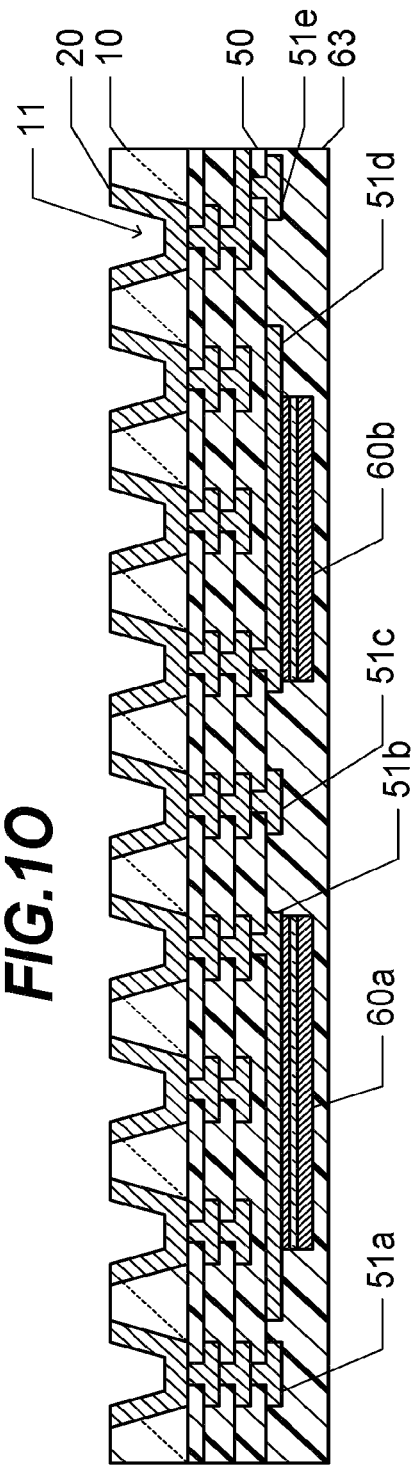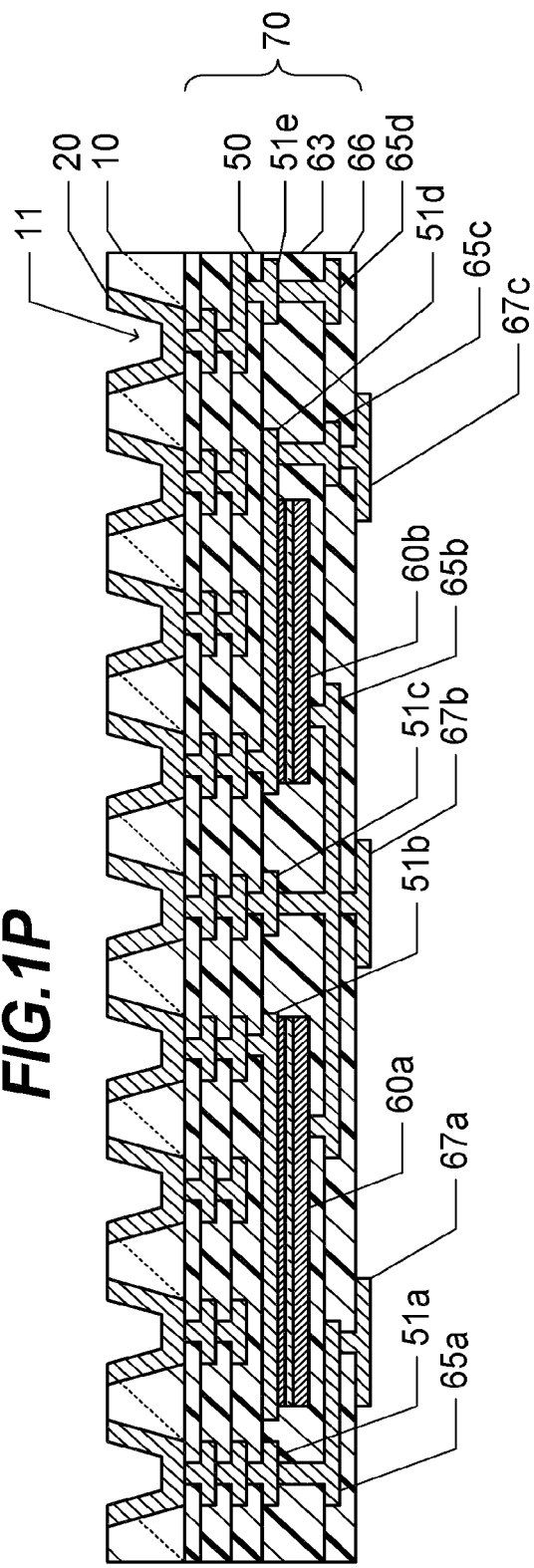

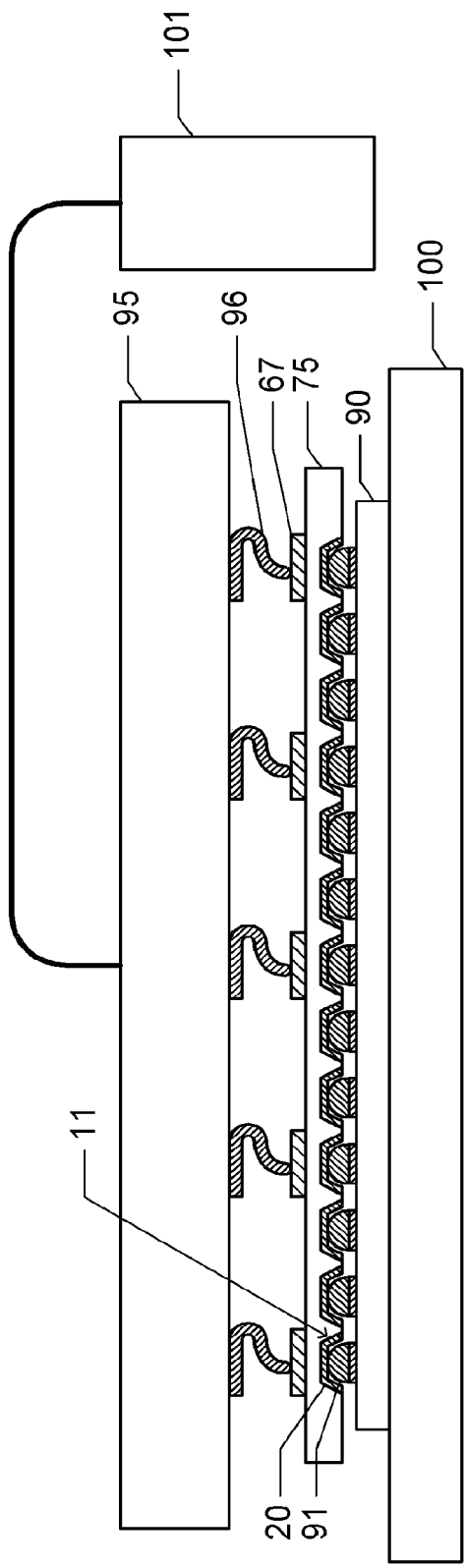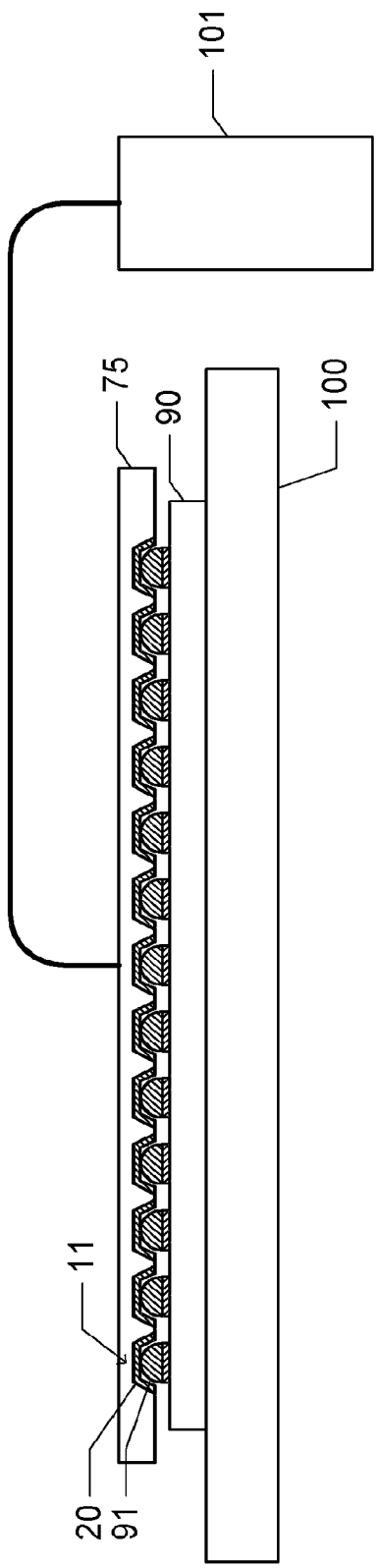

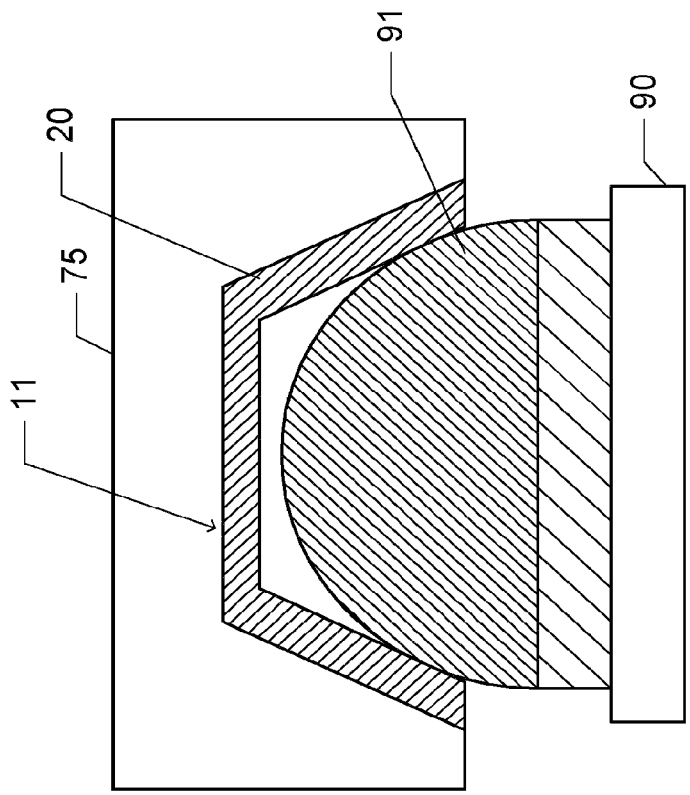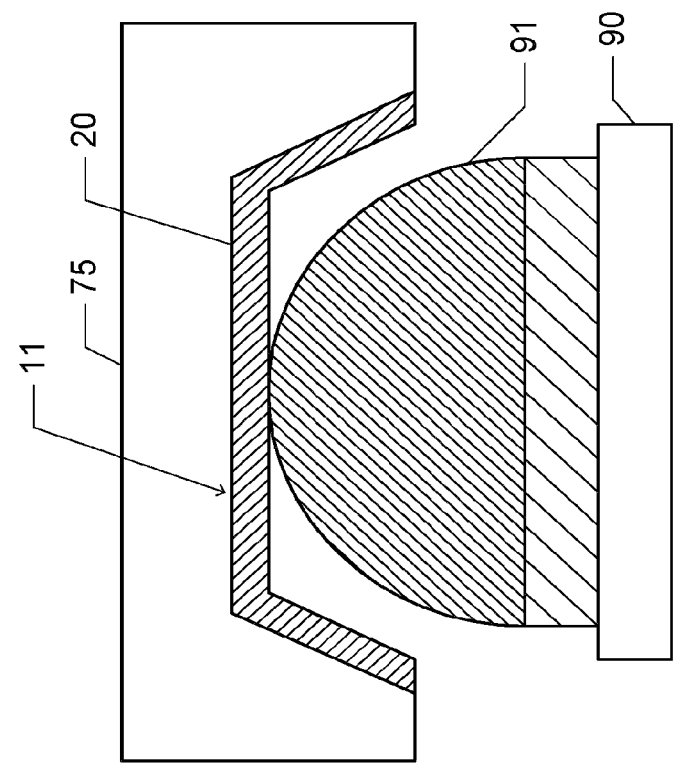

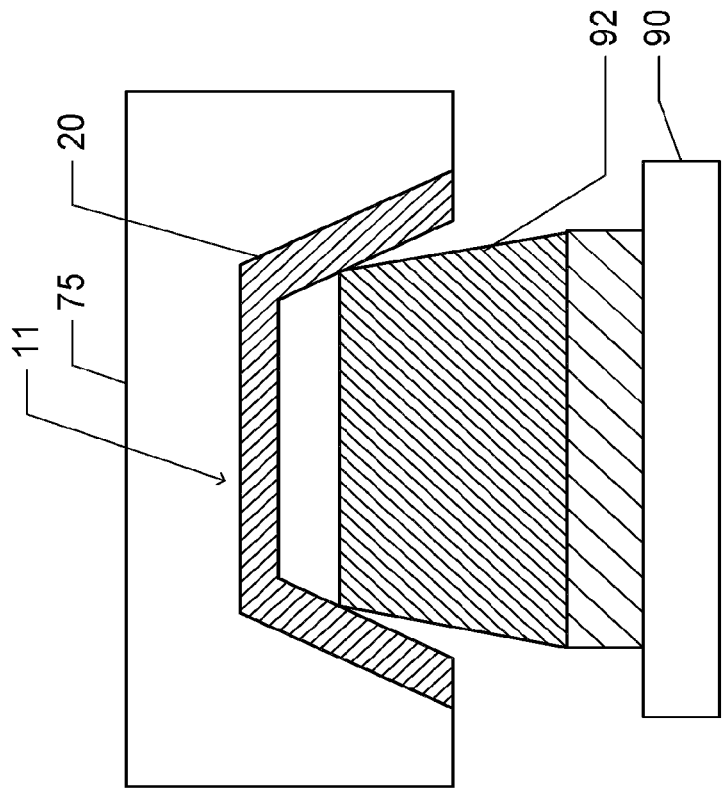
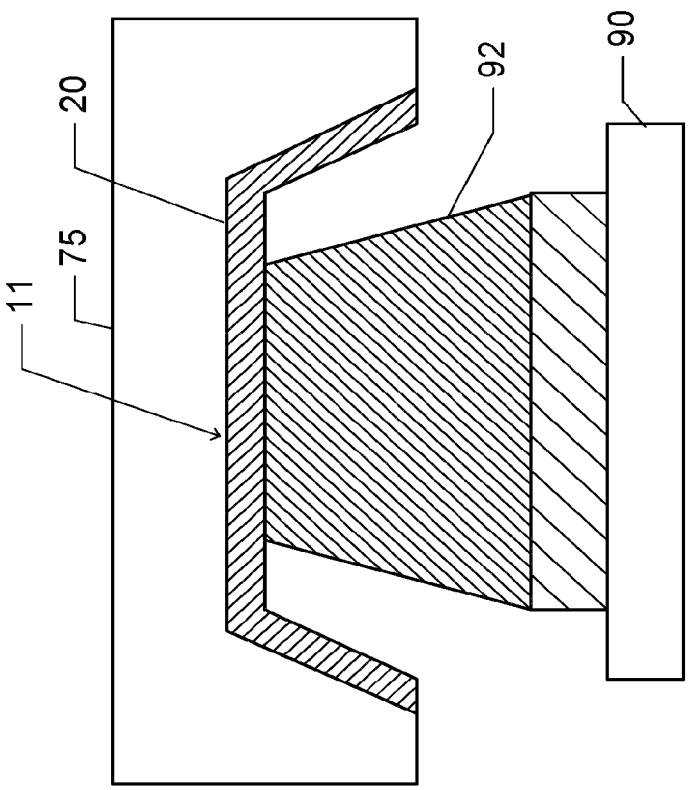

INTERCONNECTION CARD FOR INSPECTION, MANUFACTURE METHOD FOR INTERCONNECTION CARD, AND INSPECTION METHOD USING INTERCONNECTION CARD

CROSS-REFERENCE TO RELATED APPLICATION

This is a divisional application of U.S. application Ser. No. 12/824,896, filed on Jun. 28, 2010, which is a continuation of International Application No. PCT/JP2008/001037, filed on Apr. 21, 2008, the entire contents of each of which is incorporated herein by reference.

FIELD

The embodiments discussed herein are related to an interconnection card for applying current to a semiconductor integrated circuit device via its terminals for inspection, a manufacture method for an interconnection card, and an inspection method using an interconnection card.

BACKGROUND

Conventionally, in order to inspect an electric function and performance of a semiconductor integrated circuit device formed on a wafer, probe pins are contacted to electrodes or solder bumps of a semiconductor chip. Each probe pin is electrically connected to an inspection apparatus main unit via a probe card for guiding wirings.

It is intended to realize a high operation speed, a low power consumption and a high performance for a semiconductor chip including a microprocessor and a memory. A semiconductor chip capable of high speed operation, particularly at an operation frequency reaching a GHz band, is formed with solder bumps (micro solder bumps) at a narrow gap. As the bumps are formed at a narrow pitch, it becomes necessary to narrow a gap of probe pins. For example, by adopting a buildup method, it becomes possible to form fine wiring layers in a partial area of a printed board, and dispose probe pins at a high density on the uppermost layer surface (refer to Japanese Laid-open Patent Publications Nos. 2000-304770 and 2004-69692).

It is preferable to inspect a semiconductor chip in a configuration close to a configuration in which the chip is fabricated on a package substrate. In order to make the configuration during inspection close to the configuration during fabrication, terminating resistors, decoupling capacitors, inductors and the like are fabricated on a probe card. In a probe card for a semiconductor chip having bumps at a narrow pitch, decoupling capacitors for suppressing noises are fabricated in a peripheral area of the probe card or on a bottom surface opposite to a surface facing the semiconductor chip (refer to Japanese Laid-open Patent Publications Nos. 10-132855 and 2004-233155).

SUMMARY

When a semiconductor chip is inspected by using a conventional probe card, probe pins are made in contact with electrode pads or bumps of the semiconductor chip. In this case, it is desired that impressions on bumps by probe pins are reduced and that damages to the semiconductor chip are suppressed.

As the number of bumps of a semiconductor chip to be inspected increases, wirings in a probe card become complicated. In order to align the height of probe pins, the probe card is required to have rigidity. A board having a thickness of about 3 to 5 mm is therefore used for a probe card.

Furthermore, since probe pins are disposed at a high density, there is only a small area for fabricating chip components such as resistors and capacitors. If chip components are implemented on the bottom surface of a probe card, a wiring length between a semiconductor chip and chip components is about 6 to 7 mm. Inductance of a wiring itself does not become negligible, and reliability of inspection for the electrical characteristics is degraded.

According to one aspect of the invention, there is provided an interconnection card including:
  recesses formed on a surface of a substrate; and
  a conductive film covering an inner surface of each of the recesses, contacting a corresponding bump of a semiconductor device to be inspected, and being electrically connected to the bump.

According to another aspect of the invention, there is provided a method for manufacturing an interconnection card including:
  forming recesses on a first surface of a support substrate, the recesses not fully penetrating the support substrate;
  forming a conductive film on an inner surface of each of the recesses;
  grinding the support substrate from a second surface opposite to the first surface, until the conductive film is exposed; and
  forming a multi wiring layer on the second surface of the support substrate.

According to another aspect of the invention, there is provided a method for inspecting a semiconductor device including:
  facing a first surface of an interconnection card toward a semiconductor device to be inspected and bringing bumps of the semiconductor device into contact with conductive films, wherein the interconnection card comprises:
    recesses formed on the first surface of a substrate;
    the conductive films covering inner surfaces of the recesses; and
    electrode pads formed on a second surface of the substrate opposite to the first surface, each of the electrodes pads electrically connected to the conductive film in corresponding recess,
  bringing probe pins into contact with the electrode pads, and
  inspecting the semiconductor device.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 2A and 2B are schematic diagrams illustrating inspection of a semiconductor chip by using interconnection cards of the embodiment and another embodiment.

FIGS. 3A and 3B are cross sectional views illustrating contact portions between solder bumps of a semiconductor chip and conductive films of the interconnection card of the embodiment.

FIGS. 4A and 4B are cross sectional views illustrating contact portions between Au bumps of a semiconductor chip and conductive films of the interconnection card of the embodiment.

DESCRIPTION OF EMBODIMENTS

Figure 1J:
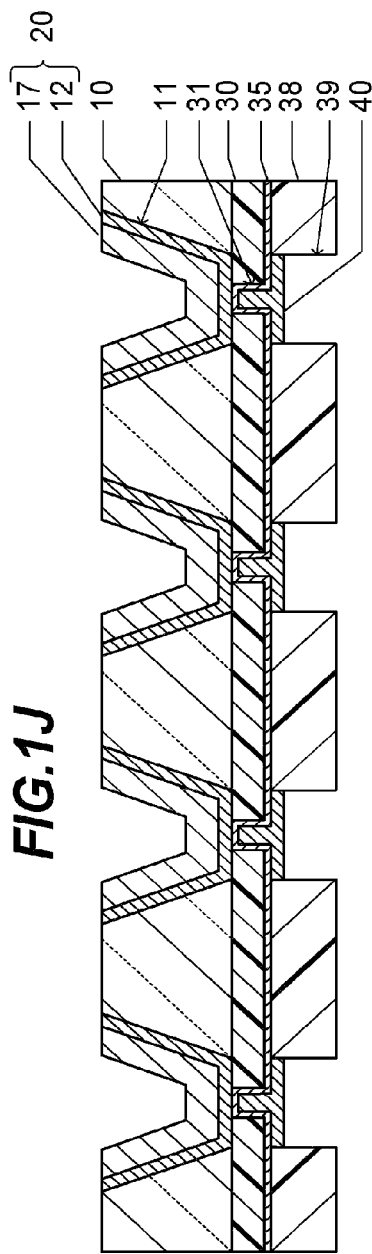
FIGS. 1A to 1O are cross sectional views of an interconnection card during manufacture according to an embodiment.
FIG. 1P is a cross sectional view of the completed interconnection card of the embodiment.

With reference to FIGS. 1A to 1P, description will be made on a manufacture method for an interconnection card according to an embodiment.

As illustrated in FIG. 1A, a support substrate 10 made of insulating material is prepared. For example, a Pyrex glass (borosilicate glass) substrate having a thickness of 200 μm may be used as the support substrate 10.

As illustrated in FIG. 1B, recesses 11 are formed on a first surface of the support substrate 10. For example, a sand blast method may be used for forming the recesses 11. Wet etching may be adopted using potassium hydroxide solution. A planar shape of each recess 11 is a circle. A side wall is slanted so that the recess 11 widens with decreasing depth from the bottom. As an example, a diameter of the recess 11 at the opening is 60 μm, a diameter at the bottom is 30 μm, and a depth is 40 μm. Each recess 11 is formed at the position corresponding to a corresponding bump formed on a semiconductor chip to be inspected.

An underlying conductive film 12 is formed on the inner surfaces of the recesses 11 and on the first surface of the support substrate 10. The underlying conductive film 12 has a two-layer structure of, for example, a Cr film having a thickness of 0.08 μm and a Cu film having a thickness of 0.6 μm. The Cr film and Cu film are formed, for example, by sputtering. The Cr film has a function of enhancing tight adhesion of the Cu film.

As illustrated in FIG. 1C, the recesses 11 are covered with resist patterns 15, and the underlying conductive film 12 on the flat surface of the support substrate 10 is etched and removed. After the underlying conductive film 12 on the flat surface is removed, the resist patterns 15 are removed. The underlying conductive film 12 remains on the inner surface of each of the recesses 11 at this point.

As illustrated in FIG. 1D, a Au film 17 is formed by electroless plating the surface of the underlying conductive film 12 with Au. A thickness of the Au film 17 is, for example, 15 μm. The inner surface of each recess 11 is therefore covered with a conductive film 20 constituted of the underlying conductive film 12 and Au film 17.

As illustrated in FIG. 1E, the support substrate 10 is grinded from a second surface opposite to the first surface on which the recesses 11 are formed, until the conductive films 20 are exposed.

As illustrated in FIG. 1F, an insulating film 30 made of photosensitive resin is formed on the second surface (bottom surface) of the support substrate 10. For example, photosensitive polyimide may be used for the insulating film 30. The photosensitive polyimide film is formed by spin coating photosensitive polyimide vanish, and thereafter prebaking the varnish at 80° C. The spin coating conditions are, e.g., a rotating speed of 2000 rpm and a time of 30 sec. A thickness of the insulting film 30 after prebaking is, e.g., 10 μm. Photosensitive epoxy resin may be used instead of the photosensitive polyimide resin.

As illustrated in FIG. 1G, via holes 31 are formed through the insulating film 30 by ordinary photolithography techniques. The via holes 31 are disposed at positions where the conductive films 20 are formed, and the conductive films 20 are exposed at the bottoms of the via holes 31. After the via holes 31 are formed, post baking is performed at 370° C. A thickness of the insulating film 30 after post baking is about 5 μm.

As illustrated in FIG. 1H, a seed film 35 is formed on the inner surfaces of the via holes 31 and on the surface of the insulating film 30. The seed film 35 is constituted of a Cr film having a thickness of 0.08 μm and a Cu film having a thickness of 0.6 μm. The Cr film and Cu film may be formed by sputtering.

As illustrated in FIG. 1I, a resist film 38 is formed on the seed film 35, and thereafter openings 39 are formed through the resist film 38. Each opening 39 is disposed at the position of a corresponding via hole 31. The seed film 35 is exposed at the bottom of the opening 39.

Figure 1K:
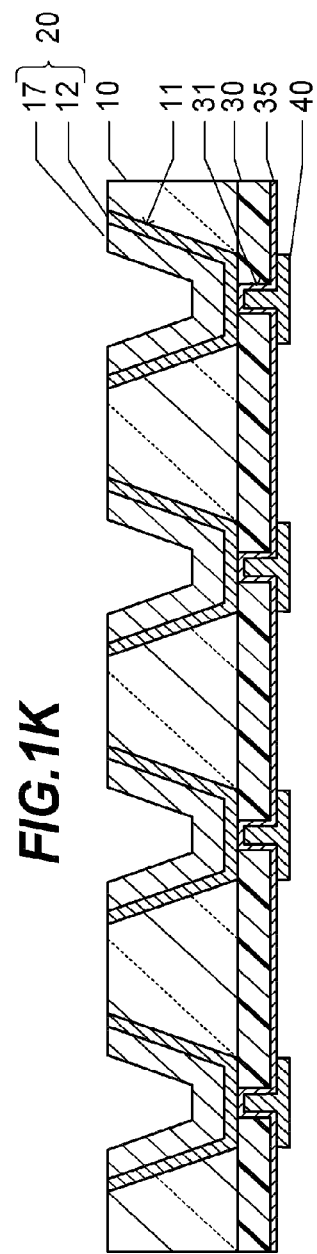
Figure 1L:
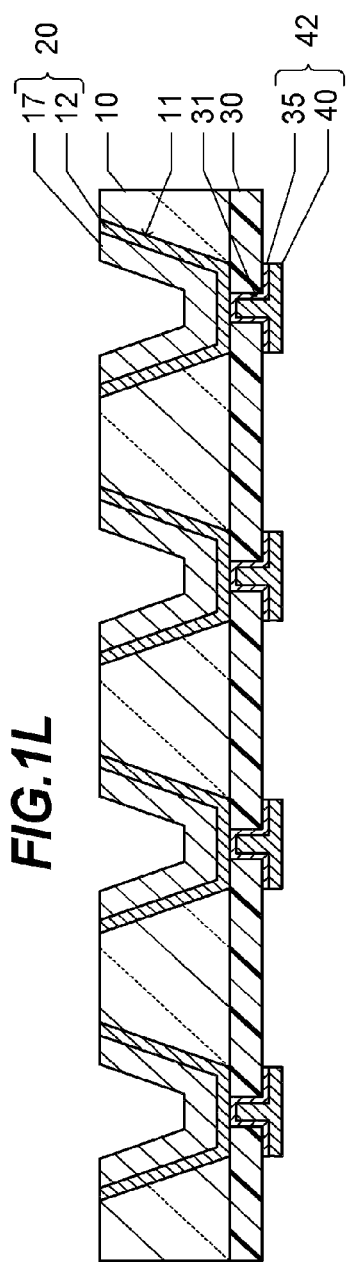

As illustrated in FIG. 1J, copper patterns 40 are formed by electroplating the seed film 35 in each opening 39 with Cu. A thickness of the copper pattern 40 is, e.g., 3 μm. As illustrated in FIG. 1K, the resist film 38 is removed. The seed film 35 is exposed in the area which was covered with the resist film 38. As illustrated in FIG. 1L, the exposed seed film 35 is etched and removed. Conductive patterns 42 each constituted of the seed film 35 and copper pattern 40 are therefore formed. The conductive pattern 42 is connected to a corresponding conductive film 20 via a corresponding via hole 31.

FIGS. 1M to 1P are cross sectional views covering a wider area than the areas covered in FIGS. 1A to 1L. More specifically, in the cross sectional views of FIGS. 1A to 1L, four recesses 11 are illustrated, whereas in the cross sectional views of FIGS. 1M to 1P, nine recesses 11 are illustrated. Further, in FIGS. 1A to 1L, the underlying conductive film 12 and Au film 17 constituting the conductive film 20 are distinctly drawn, whereas in FIGS. 1M to 1P, the underlying conductive film 12 and Au film 17 are drawn with no distinction. The seed film 35 and copper pattern 40 constituting the conductive pattern 42 are also drawn with no distinction.

Figure 1M:
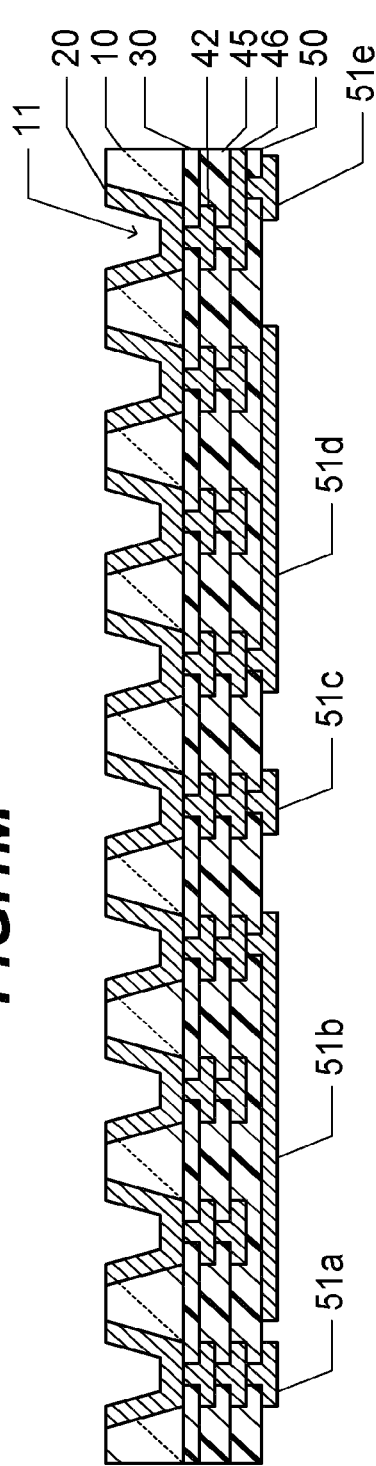

As illustrated in FIG. 1M, an insulating film 45, a second wiring layer 46, an insulating film 50 and a third wiring layer are formed on the insulating film 30 and conductive patterns 42. These insulating films and wiring layers are formed by the same processes as those from a process of forming the insulating film 30 illustrated in FIG. 1G to a process of forming the conductive patterns 42 illustrated in FIG. 1L. The third wiring layer contains wirings 51a to 51e. Each of the wirings 51b and 51d has a wider planar shape than the other wirings in order to dispose capacitors on the wirings 51b and 51d.

Figure 1N:
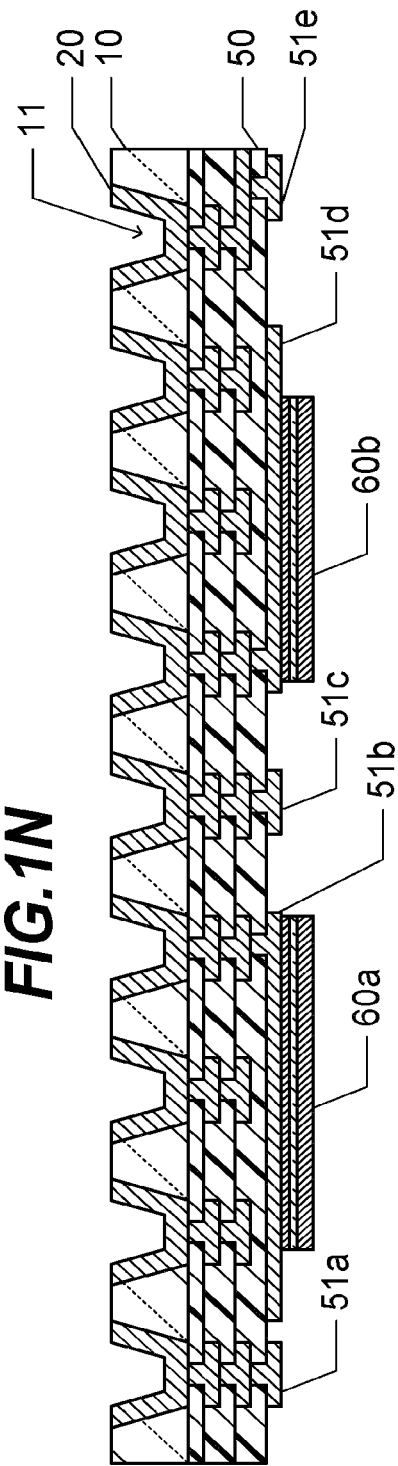

As illustrated in FIG. 1N, capacitors 60a and 60b are bonded to the upper surfaces of the wirings 51b and 51d, respectively. In the following, description will be made on an example of a method of forming the capacitors 60a and 60b.

First, a surface of an aluminum foil having a thickness of 0.08 mm is electrolytically etched to form a porous structure. The aluminum foil is washed by hydrofluoric nitric acid and distilled water, and anodization is performed in aqueous solution in which ammonium adipic acid of 150 g dissolves relative to pure water of 1000 mL. An aluminum oxide cover film is therefore formed on the surface of the aluminum foil. A temperature of the aqueous solution during anodization is 85° C., an anodization voltage is 100 V, a current is 0.3 A and a voltage application time is 20 min.

Solution containing polyethylene dioxithiophene (PEDOT) and styrene sulfonic acid is coated on the surface of the aluminum oxide cover film, and then dried. Coating and drying are performed twice to obtain a conductive polymeric film having a thickness of 15 μm. An electrolytic capacitor is therefore obtained having the aluminum foil as an anode and the conductive polymeric film as a cathode. The conductive polymeric film is bonded to each of the wirings 51b and 51d using conductive pastes, e.g., Ag pastes.

A niobium foil having a thickness of, e.g., 0.1 mm may be used instead of the aluminum foil. Anodization of the niobium foil is possible, e.g., in phosphoric acid solution. A solution temperature during anodization is 90° C., an anodization voltage is 150 V, a current is 0.6 A and a voltage application time is 10 min. Niobium oxide has a relative dielectric constant higher than that of aluminum oxide. A large capacitance of a capacitor is therefore expected.

As illustrated in FIG. 1O, an insulating film 63 made of photosensitive resin is formed covering the insulating film 50, third layer wirings 51a to 51e and capacitors 60a and 60b.

As illustrated in FIG. 1P, via holes are formed through the insulating film 63, and a fourth wiring layer is formed on the insulating film 63. The fourth wiring layer contains wirings 65a to 65d. The wiring 65a is connected to the third layer wiring 51a by way of the via hole which is formed in the insulating film 63. The wiring 65b is connected to the anodes of the capacitors 60a and 60b and the third layer wiring 51c by way of the via holes which are formed in the insulating film 63. The wiring 65c is connected to the third layer wiring 51d by way of the via hole which is formed in the insulating film 63. The wiring 65d is connected to the third layer wiring 51e by way of the via hole which is formed in the insulating film 63.

An insulating film 66 made of photosensitive resin is formed covering the insulating film 63 and fourth layer wirings 65a to 65d. Via holes are formed through the insulating film 66, and electrode pads 67a to 67c are formed on the insulating film 66. The electrode pads 67a to 67c have a three-layer structure of, e.g., a Ti film, a Ni film and an Au film stacked in the recited order.

The electrode pad 67a is connected to the fourth layer wiring 65a by way of the via hole which is formed in the insulating film 66. The electrode pad 67b is connected to the fourth layer wiring 65b by way of the via hole which is formed in the insulating film 66. The electrode pad 67c is connected to the fourth layer wiring 65c by way of the via hole which is formed in the insulating film 66. The conductive patterns 42, wirings 46, 51a to 51e, and 65a to 65d, and insulating layers between wirings constitute a multi wiring layer 70.

The cathode of the capacitor 60b is connected to the electrode pad 67c through the wirings 51d and 65c, and the anode thereof is connected to the electrode pad 67b via the wiring 65b. A ground voltage is applied to the electrode pad 67c, and a power source voltage is applied to the electrode pad 67b. The capacitor 60b functions therefore as a decoupling capacitor for reducing power source noises.

The uppermost surface electrode pad is connected also to the third layer wiring 51b connected to the cathode of the capacitor 60a. The wiring 51b may be connected to the wiring 51d through the wiring in the same wiring layer or in another wiring layer.

In the embodiment described above, the recesses 11 with the bottoms are formed on the support substrate having a mechanical bearing capability, and then the support substrate 10 is grinded from the bottom surface. In the result, the conductive films 20 formed on the first surface (top surface) are exposed on the second surface (bottom surface). By forming the multi wiring layer 70 on the second surface of the support substrate 10 using buildup method, it is possible to form the electrode pad 67a on the uppermost surface of the multi wiring layer 70, the electrode pad 67a being electrically connected to the conductive film 20 on the first surface side of the support substrate 10. Without forming a through hole through the substrate having rigidity, it is therefore possible to electrically connect the conductive film 20 on the first surface side to the electrode pad 67a on the bottom surface side.

FIG. 2A is a schematic diagram illustrating inspection of a semiconductor chip by using the interconnection card of the above-described embodiment. A semiconductor chip 90 is placed on a stage 100 of an inspection apparatus. Solder bumps 91 are formed on a surface of the semiconductor chip 90. Each solder bump has a shape of a sphere whose portion is cut away. The above-described interconnection card 75 is disposed above the semiconductor chip 90. Recesses 11 are formed on a front surface of the interconnection card 75, and a conductive film 20 is formed on an inner surface of each recess 11. Electrodes pads 67 are formed on the back surface of the interconnection card 75.

FIG. 3A is an enlarged cross sectional view illustrating a solder bump 91 and a recess 11. The solder bump 91 is inserted into the recess 11, and the uppermost portion of the solder bump 91 contacts the conductive film 20 formed on the bottom of the recess 11. Electrical connection is therefore ensured between the solder bump 91 and conductive film 20. As illustrated in FIG. 3B, the side surface of a solder bump 91 may contact the conductive film 20 on the side surface of the recess 11.

In FIG. 2A, a plurality of probe pins 96 are provided on the probe card 95. Tips of the probe pins 96 contact the electrode pads 67. The probe card 95 is connected to an inspection apparatus main unit 101 via signal cables.

When the interconnection card 75 of the embodiment is used, the conductive films 20 contact the solder bumps 91, but the tips of the probe pins 96 will not contact the solder bumps 91. It is therefore possible to reduce damages of the solder bumps to be caused by contact of the probe pins.

The layout of the electrode pads 67 are able to be changed freely by the multi wiring layer 70 of the interconnection card 75, without being restricted by the layout of the conductive films 20 electrically connected to the electrode pads 67. The positions of solder bumps 91 for a power source voltage and a ground voltage of the semiconductor chip 90 are not necessarily the same for all product types. Even if the positions of solder bumps 91 for a power source voltage and a ground voltage of the semiconductor chip are different, the positions of electrode pads 67 for a power source voltage and a ground voltage are made to be common among all product types by preparing the interconnection card 75 for each of product types of the semiconductor chip 90. It is therefore possible to inspect semiconductor chips 90 of various product types having different positions of solder bumps 91 for a power source voltage and a ground voltage by using a single probe card 95.

It is possible to fabricate decoupling capacitors in the interconnection card 75. The decoupling capacitors are connected to the semiconductor chip without the probe pins 96. It is therefore possible to eliminate the influence of parasitic inductance of the probe pins 96 and inspect a semiconductor chip in a configuration close to an actual mounting configuration.

It is possible to make a distance between adjacent recesses 11 narrower than a distance between adjacent electrode pads 67. Even if the pitch of bumps 91 formed on the semiconductor chip 90 is made narrow, a conventional probe card is able to be used by preparing an interconnection card having a narrowed pitch of recesses 11 without narrowing pitch of electrode pads 67. In this case, in general, conductive films 20 for a power source voltage outnumber the electrode pads 67 for a power source voltage. The conductive films 20 for a ground voltage also outnumber the electrode pads 67 for a ground voltage.

In FIG. 2A, although inspection is performed after a wafer is divided into semiconductor chips, inspection may be performed before a wafer is divided into chips. If inspection is performed before a wafer is divided into chips, inspection is performed by disposing the interconnection card 75 on an inspection target chip area in the wafer.

FIG. 2B is a schematic diagram illustrating an interconnection card of another embodiment together with an inspection apparatus. In the embodiment illustrated in FIG. 2B, an interconnection card 75 is connected directly to an inspection apparatus main unit without a probe card. A conventional probe card may be replaced with the interconnection card of the embodiment in this manner.

FIGS. 4A and 4B are cross sectional views illustrating a contact portion between an Au bump 92 and a conductive film 20 when a semiconductor chip having the Au bump 92 in place of the solder bump 91 is inspected. The solder bump 91 has a sphere, portion of which is cut away, whereas the Au bump 92 has a shape like a frustum of circular cone. As illustrated in FIG. 4A, the upper surface of the Au bump 92 may contact the conductive film 20 formed on the bottom of the recess 11, or an edge defined by the side wall and upper surface of the Au bump 92 may contact the conductive film 20 formed on the side wall of the recess 11.

In FIGS. 3A to 4B, it is preferable that a depth from a surface on which the recess 11 is formed to a surface of the conductive film 20 formed on the bottom of the recess 11 is made shallower than a height of each of the bumps 91 and 92. With this arrangement, it is possible to prevent contact failure between the bump 91, 92 and the conductive film 20.

It is preferable that the recess 11 has a shape widening toward the opening plane. This shape is able to tolerate margins of position error of the bumps 91, 92 to the recess 11.

All examples and conditional language received herein are intended for pedagogical purposes to aid the reader in understanding the invention and the concepts contributed by the inventor to furthering the art, and are to be construed as being without limitation to such specifically recited example and conditions, nor does the organization of such examples in the specification relate to a showing of the superiority and inferiority of the invention. Although the embodiments of the present invention have been described in detail, it should be understood that the various changes, substitutions, and alterations could by made hereto without departing from the spirit and scope of the invention.

What is claimed is:

1. A method for manufacturing an interconnection card comprising:
   preparing a support substrate of insulating material, which has a first surface and a second surface opposite to the first surface;
   forming recesses on the first surface of the support substrate, which do not fully penetrate the support substrate, the second surface of the support substrate being flat;
   selectively forming conductive films on inner surfaces of the recesses, each covering a side surface and a bottom of one of the recesses;
   grinding the second surface of the support substrate, until bottoms of the conductive films are exposed from the second surface; and
   forming a multi wiring layer on the second surface of the support substrate, the multi wiring layer comprising insulating films made of resin and wiring layers made of conductive patterns, one of the wiring layers nearest to the support substrate including the conductive patterns which locate on the second surface and are in electrical contact with the bottoms of the conductive films.

2. The method for manufacturing the interconnection card according to claim 1, wherein the support substrate comprises silicate glass, and the recesses are formed by removing a portion of the silicate glass by a sand blast method.

3. The method for manufacturing the interconnection card according to claim 1, further comprising forming electrode pads to be electrically connected to probe pins, on an exposing surface of the multi wiring layer.

* * * * *